United States Patent [19]

Yeh et al.

[11] Patent Number: 5,410,556
[45] Date of Patent: Apr. 25, 1995

[54] PIPELINED VITERBI DECODER

[75] Inventors: Nan-Hsiung Yeh, Foster City; Charles R. Olson, Cupertino, both of Calif.

[73] Assignee: Ampex Corporation, Redwood City, Calif.

[21] Appl. No.: 146,365

[22] Filed: Oct. 29, 1993

[51] Int. Cl.⁶ .......................................... H03M 13/12
[52] U.S. Cl. .................................. 371/43; 375/341
[58] Field of Search ............... 371/6, 30, 37.9, 43–46; 375/18, 76, 94, 101, 99; 341/56, 57

[56] References Cited

U.S. PATENT DOCUMENTS

| | | | |
|---|---|---|---|
| 3,891,959 | 6/1975 | Tsuji et al. | |
| 5,014,276 | 5/1991 | Bush et al. | 371/43 |
| 5,042,036 | 8/1991 | Fettweis | 371/43 |
| 5,341,387 | 8/1994 | Nguyen | 371/45 |

FOREIGN PATENT DOCUMENTS

| | | | |
|---|---|---|---|
| 0469647 | 2/1992 | European Pat. Off. | 375/94 |
| 2059224 | 4/1981 | United Kingdom | 375/101 |

OTHER PUBLICATIONS

R. Wood nd D. Petersen, "Viterbi Detection of Class IV Partial Response on a Magnetic Recording Channel", EEE Trans. on Comm., COM-34, No. 5, pp. 454–461, 1986.

*Primary Examiner*—Roy N. Envall, Jr.
*Assistant Examiner*—Steven R. Garland
*Attorney, Agent, or Firm*—John G. Mesaros; George B. Almeida; Charles J. Barbas

[57] ABSTRACT

A pipelined Viterbi decoder includes a plurality of circuit stages and a synchronous clocking arrangement for controlling the operations of the circuits within each stage. Specifically, an input stage converts multi-level input signals into streams of even and odd digital data samples. A parallel-precomputation stage adaptively establishes a threshold range for each sample, while a sequence detection stage designates one of the multiple levels for that sample and then determines the validity of that designation. Validity is determined in accordance with the sequence property of alternate samples in multi-level coding. Violations of the sequence property are corrected by a sequence correction stage so that valid, coded data and clock signals are provided at the outputs of the decoder.

17 Claims, 4 Drawing Sheets

PIPELINED VITERBI DECODER

FIELD OF THE INVENTION

This invention relates generally to error detection and correction systems, and more particularly to maximum-likelihood sequence detection and correction of multi-level coded signals for systems having high-data rates.

BACKGROUND OF THE INVENTION

High-quality digital telecommunications and recording systems require channels capable of reliably supporting high-data rates. For example, transmission rates for high definition television (HDTV) signals may range from 150 megabits-per-second (Mb/s) to more than 1000 Mb/s, while some digital video applications require high-density, magnetic recording at rates in excess of 200 Mb/s.

With high-density recording, closely-situated flux transitions overlap and produce interference, i.e., intersymbol interference, between the symbols they represent. Intersymbol interference may arise because of insufficient bandwidth at head-medium channels (for recording applications) and transmission channels (for telecommunication applications).

Performance of high-data rate channels may be increased through use of Class-4 partial response (PR4) coding in a data storage or transmission channel using a data detector configured to implement a Viterbi algorithm during data retrieval or reception. Specifically, PR4 coding controls intersymbol interference at limited bandwidth while allowing a significant increase in the data rates of the channels. Moreover, partial-response coding provides high correlation between data sequences, thereby facilitating prediction of erroneous data values.

A PR4 waveform is a 3-valued (ternary) signal having "high", "middle" or "low" values, where a "high" or "low" value is a binary "1" and a "middle" value is a "0". The PR4 waveform is derived from a binary waveform by subtracting, from the binary waveform, a 2-bit interval, delayed version of itself. Before re-conversion to binary format, the PR4 data stream is decomposed into successions derived from alternate samples. These "even" and "odd" successions of samples conform to the sequence property of PR4 coding which states that "high" and "low" signals must alternate and may be separated by any number of "middle" values.

The Viterbi algorithm provides an iterative method of determining the maximum-likelihood sequences of these alternate data samples, despite interference, and Viterbi detectors/decoders operate to process the data sequences in accordance with the algorithm. An example of a conventional Viterbi decoder is set forth in an article titled, The Viterbi detection of class 4 partial response on the magnetic recording channel, by Roger Wood and David Peterson, IEEE Transactions on Communications, vol. COMM-34, no. 5 (1986).

The Wood et al. Viterbi decoder comprises an A/D conversion circuit, Viterbi logic and a random-access memory (RAM). The Viterbi logic block includes a single processing path of logic devices coupled to the RAM. Circuit operation is basically asynchronous since re-clocking occurs only after signal processing. Moreover, the circuit includes a feedback loop for calculating various threshold levels needed for Viterbi decoding; this feedback loop contributes significant delays to the operation of the decoder. Accordingly, these factors impact reliable sequence detection operations at high frequencies and the present invention is directed to improving the speed and reliability of maximum likelihood sequence detection and correction.

SUMMARY OF THE INVENTION

The present invention resides in a pipelined Viterbi decoder having a plurality of circuit stages and a synchronous clocking arrangement for controlling the operations of the circuits within each stage. Specifically, the pipelined decoder includes an input stage for converting multi-level input signals into streams of even and odd digital data samples. A parallel-precomputation stage adaptively establishes a threshold range for each sample, while a sequence detection stage designates one of the multiple levels for that sample and then determines the validity of that designation. Validity is determined in accordance with the sequence property of alternate samples in multi-level coding. Violations of the sequence property are corrected by a sequence correction stage so that valid, coded data and clock signals are provided at the outputs of the decoder.

In the illustrative embodiment of the invention, the parallel precomputation stage comprises a plurality of parallel processing paths that compare a current input sample with various threshold reference levels so that a "high", "middle" or "low" ternary level may be assigned for that sample. Typically in prior decoders, these threshold levels are generated via feedback loops having associated delay elements that significantly reduce the processing speed of the decoders. However, in accordance with the present invention, the highly-parallel configuration described herein obviates the need for such feedback loops, thereby eliminating their associated delays while increasing the processing throughput of the decoder during maximum-likelihood sequence detection of erroneous signals.

Specifically, five threshold reference levels are simultaneously computed and compared with a current sample at the parallel precomputation stage. Upper and lower threshold decision output signals are then generated for use by the sequence detection stage. These threshold decisions are combined at the circuits of the latter stage into a single, two-valued bit-stream such that "high" and "low" values become "1", and "middle" values become "0". Information about the ternary level from which each "1" value is derived is also obtained from the sequence detection stage circuits. Data and control signals are provided for loading, shifting and erasing the contents of data and flag shift-registers located in the sequence correction stage.

Here, the contents of these shift-registers are coupled, in parallel, to exclusive-OR (XOR) gate circuits for correcting selected data violations of the alternate sequence property. Correction is accomplished by tracking, via the flag shift-register, each bit in the data shift-register having a "1" value and thereafter inverting that bit if the sequence detection stage identifies it as being in error. If the "flagged" bit is determined not in error, it is simply shifted, unchanged, through the sequence correction stage to the output of the decoder and thereafter furnished as non-return-to-zero (NRZ) data.

An advantage of the pipelined decoder is reliable, high frequency decoding operations on multi-level coded input signals. That is, the novel decoder enables completion of the above-described operations in one clock cycle, thereby significantly improving the processing speed of maximum-likelihood sequence detection and correction of erroneous signals. High-speed processing is achieved, in part, by the highly-parallel circuit configuration of the novel parallel-precomputation stage. In addition, the pipeline topology and synchronous clocking arrangement among the stages of the Viterbi decoder allow for a reduction in the number of circuits in each stage, thereby increasing the frequency of operations.

BRIEF DESCRIPTION OF THE DRAWINGS

The above and further advantages of the invention may be better understood by referring to the following description in conjunction with the accompanying drawings, in which.

DETAILED DESCRIPTION OF ILLUSTRATIVE EMBODIMENTS

Figure 1:
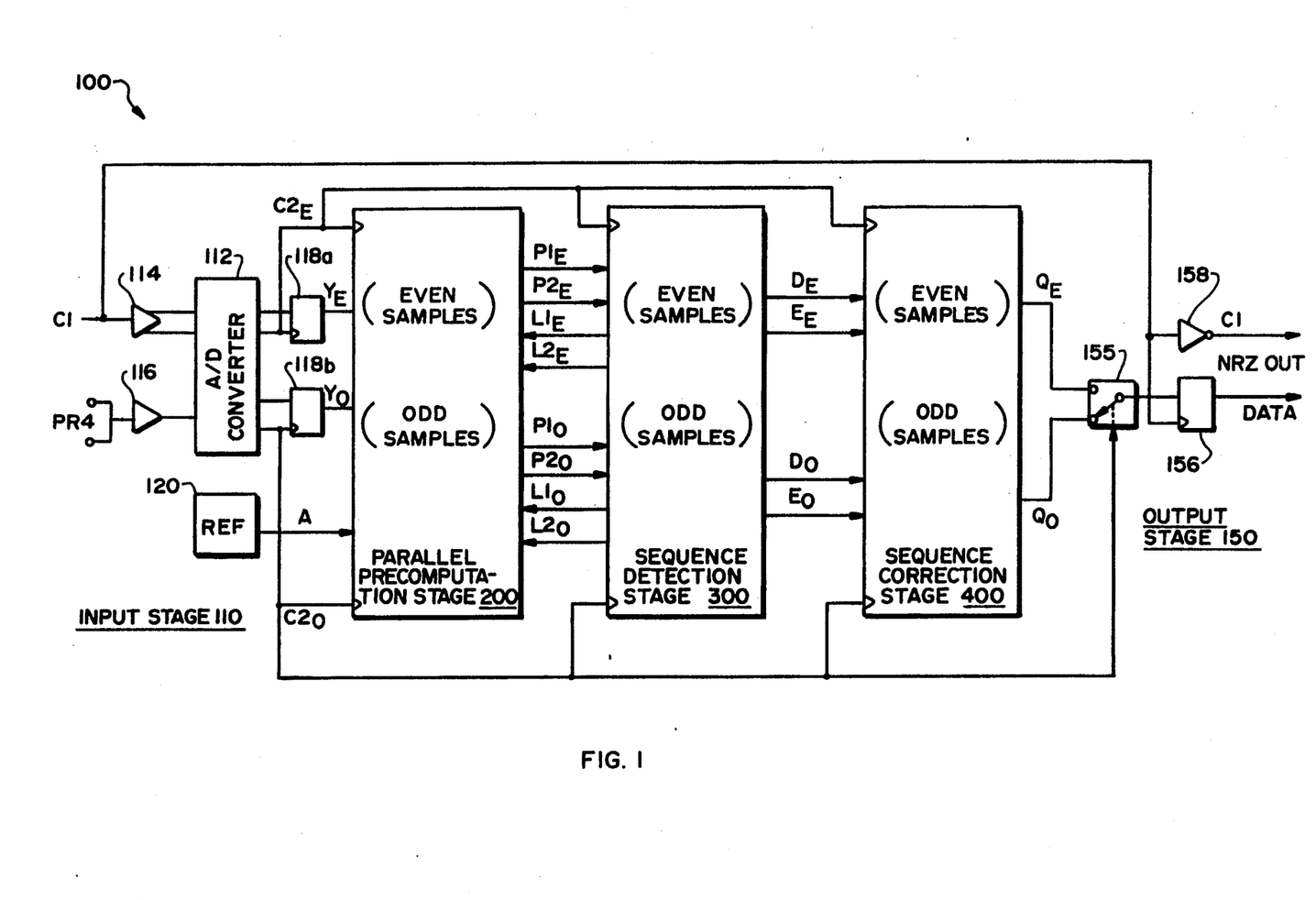
FIG. 1 is a block diagram of an improved, multi-stage Viterbi decoder circuit in accordance with the invention.

Referring to FIG. 1, an improved Viterbi decoder 100 comprises a plurality of synchronized circuit stages having a pipelined topology that increases the speed of decoding operations. The pipelined decoder comprises an input stage 110, a parallel-precomputation stage 200, a sequence detection stage 300, a sequence correction stage 400 and an output stage 150.

In general, the improved decoder 100 (i) receives three-level (ternary), class-4 partial response (PR4) signals, (ii) discerns, despite interference, the correct values of the PR4 signals, (iii) converts the signals to non-return-to-zero (NRZ) signal format, and (iv) distributes these corrected PR4 values as NRZ output signals of the circuit. In accordance with the invention, a multi-stage, synchronous clocking arrangement increases the speed of Viterbi decoding by allowing a reduction in the number of circuits between clocking devices, e.g., registers, situated at the inputs to the various stages. Since the registers are synchronized to the same clock signals, reducing the circuits between them allows for higher speed operation of the decoder which, for the illustrative embodiment disclosed herein, is potentially 400 MHz or more.

Clock signals C1 and PR4 signals are received at the input stage 110 and delivered to a 1:2 demultiplexed, analog-to-digital (A/D) converter 112. The C1 signals, which preferably have rising transitions centered on consecutive data bit cells, drive a simple complementary output signal device 114, which generates differential output signals. A conventional driver circuit 116 transmits the PR4 signals to the converter 112.

The A/D converter 112 delivers two digitized data streams of even and odd data samples, each at half the input rate. Thus, for a 400 Mb/s PR4 input data stream, the converter 112 produces a 200 Mb/s stream of even samples $Y_e$, with odd samples $Y_O$ in a second 200 Mb/s stream. These data streams are staggered such that transitions in the even sample stream $Y_E$ are exactly halfway between transitions in the odd sample stream $Y_O$. The even and odd samples are then passed through registers 118a,b to the parallel-precomputation stage 200.

The A/D converter 112 also delivers two half-rate clock signals $C2_{E,O}$, where the odd clock signal $C2_O$ is an inverted form of the even clock signal $C2_E$. These clock signals are presented to each stage of the decoder 100 to provide a synchronous timing arrangement in accordance with the invention.

A constant value A, generated at the input stage 110 by a reference thumbwheel circuit 120, is also provided to the parallel-precomputation stage 200. The value A is preferably a 6-bit value representing approximately half-amplitude of the incoming PR4 data signals. In accordance with execution of the Viterbi algorithm, the value A introduces an offset for determining the correct values of erroneous PR4 signals. An amplitude detection circuit, such as an automatic amplitude tracking circuit (not shown), ensures that a full range of digital values is produced by the converter so that there is no loss of resolution despite changes in the amplitude of the incoming PR4 signals.

In accordance with the invention, the parallel-precomputation stage 200 adaptively establishes a threshold range for determining the amplitude estimate of a particular sample, while the sequence detection stage 300 feeds back information to determine into which of the three levels that sample should be placed. This latter circuit then determines the validity of that designation according to the sequence property of alternate samples in PR4 coding. Violations of the sequence property are corrected by the sequence correction stage 400, which tracks 16-bits of sample data and changes "bits-in-question" when the violations are discovered, as described further below.

Two half-rate, corrected data streams, i.e., even and odd samples $Q_{E,O}$, are delivered from the sequence correction stage 400 to the output stage 150. Here, the samples are "recombined" via a multiplexer switch 155 that is preferably timed by the half-rate, odd clock signal $C2_O$. The output of the switch 155 is coupled to the data input of register 156 that is clocked by the full-rate clock signals C1. The C1 signals are also transposed by inverter 158, so that corrected, full-rate NRZ data and clock signals may be provided at the output of the decoder.

The parallel-precomputation stage 200, the sequence detection stage 300 and the sequence correction stage 400 are each preferably apportioned into two, identical circuit sections, one for each sample stream $Y_E$ and $Y_O$. For ease of description and depiction, only one section will be described for the two former stages, with the description including general references to sample Y and half-rate clock signal C2.

Figure 2:
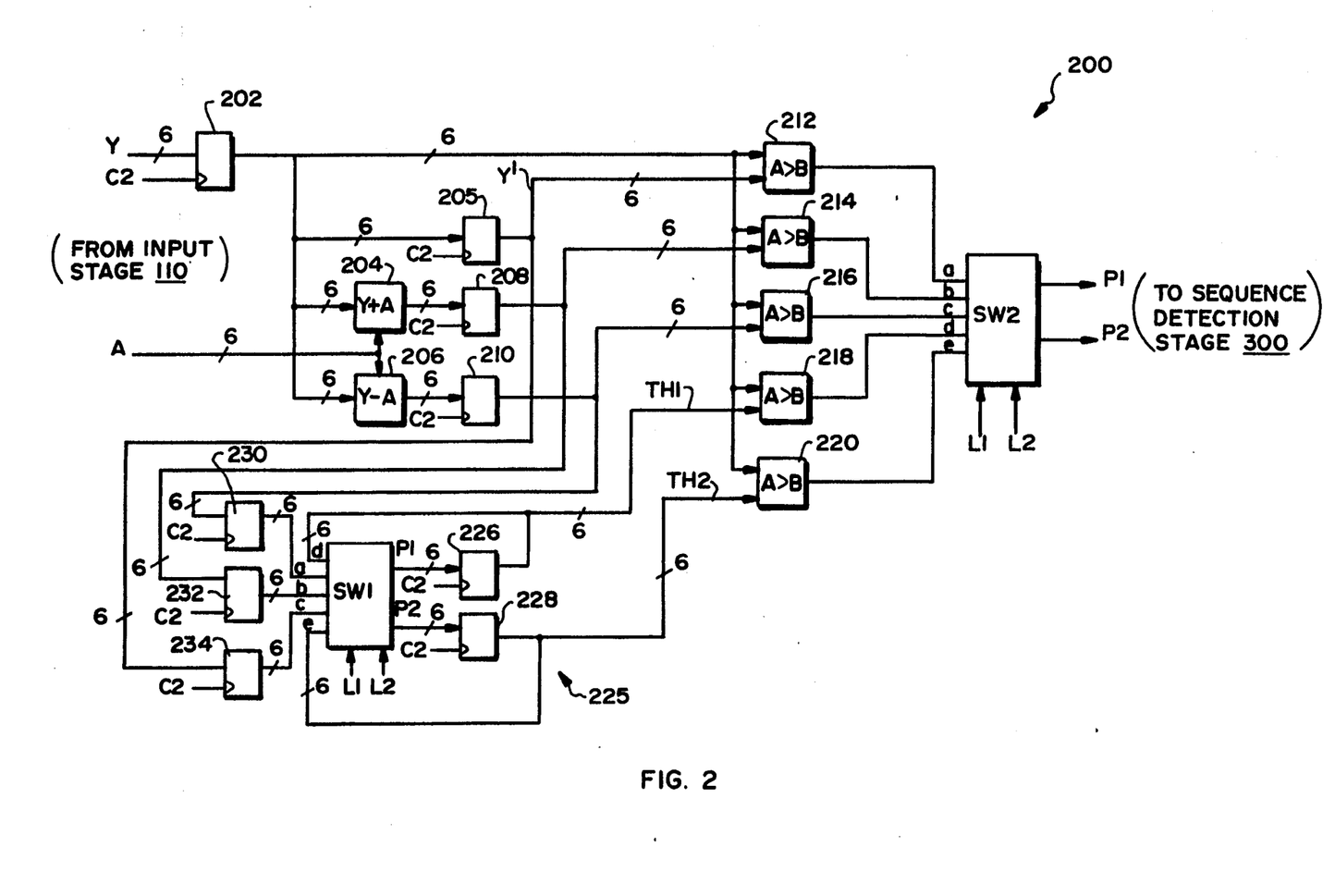
FIG. 2 is a circuit schematic of a parallel-precomputation stage of the Viterbi decoder shown in FIG. 1.

FIG. 2 is a circuit schematic of the parallel-precomputation stage 200. A current 6-bit, input sample Y is received at register 202 and forwarded to first inputs of comparators 212–220 on the next clock cycle C2. It should be noted that term "registers" used herein denotes devices that preferably contain six, edge-triggered 1-bit, D-type flip-flops. With respect to the circuits of FIGS. 2–4, these devices are operated in synchronism with the clock signal pulse train C2.

In accordance with the teachings of the invention, a plurality of parallel processing paths are utilized in the parallel-precomputation stage for comparing the current input sample Y with various threshold levels so that a "high", "middle" or "low" condition (ternary value) may be assigned to that sample. In one embodiment of the invention, two parallel paths may be used; however, this configuration may be extended to further increase processing speed and, for the illustrative embodiment described herein, five parallel-processing paths are utilized.

Specifically, the input sample Y is temporarily stored in register 205 and then passed to a second input of comparator 212 as sample Y'. Two "offset" reference streams are generated from sample Y by adding to it, and subtracting from it, the 6-bit value A. The <Y+A> block 204 and the <Y−A> block 206 represent respective adder and subtractor circuits, with their sum and difference outputs coupled to second inputs of comparators 214, 216 via registers 208, 210, respectively. The Y', <Y+A> and <Y−A> reference levels are each passed through the registers and delayed by one clock cycle so that they may represent previous samples at the inputs of the comparators 212–216.

Comparators 218 and 220 are configured to compare the current sample Y with previous threshold levels TH1 and TH2. TH1 and TH2 are generated by a hold-state circuit 225 having, at its nucleus, a switch SW1. Specifically, the outputs P1, P2 of switch SW1 are returned, via registers 226, 228, as inputs d,e to SW1, while also being presented to comparators 218, 220 as TH1 and TH2, respectively. The remaining inputs a–c of the SW1 are further delayed versions, via registers 230–234, of the reference levels Y', <Y+A> and <Y−A>.

Control signals L1, L2 enable SW1 to select two of its inputs as outputs P1, P2 in accordance with the following SW1 truth table:

| | SW1 | | | |
|---|---|---|---|---|
| L1 | 1 | 0 | 0 | 1 |
| L2 | 0 | 1 | 0 | 1 |
| P1 | c | b | d | b |
| P2 | a | c | e | c |

The control signals L1, L2 are 1-cycle delayed versions of outputs P1, P2 of switch SW2, as described further below. A hold condition is provided by the hold-state circuit 225 when L1, L2 each assume a "0" state. In this case, inputs d,e are selected as outputs of SW1, as described above.

The current input sample Y is thus simultaneously compared in magnitude with each of the unmodified previous sample Y' at comparator 212, the previous sample <Y+A> at comparator 214, the previous sample <Y−A> at comparator 216, the previous threshold TH1 at comparator 218 and the previous threshold TH2 at comparator 220 to provide a parallel-processing arrangement that obviates feedback loop delays associated with prior decoders.

The outputs of the comparators 212–220 are coupled to inputs a–e of a switch SW2. Here, control signals L1, L2 are also used to enable SW2 to select two of these inputs as outputs P1, P2 in accordance with the following SW2 truth table;

| | SW2 | | | |
|---|---|---|---|---|
| L1 | 1 | 0 | 0 | 1 |
| L2 | 0 | 1 | 0 | 1 |
| P1 | a | b | d | a |
| P2 | c | a | e | b |

The outputs P1 and P2 of SW2 represent upper and lower threshold decisions that are used, inter alia, to update the previous thresholds TH1 and TH2. Specifically, the switches SW1 and SW2 are configured to either adaptively update TH1 and TH2, or select them at the corresponding comparator outputs 218, 220. Updating of these previous thresholds, which represent the slowest computations in the parallel-precomputation stage, is thus spread over two clock cycles, thereby eliminating potential processing bottlenecks. More specifically, TH1 and TH2 are updated when the current sample Y has a true "±1" state. That is, if the incoming sample is a true "0", TH1 and TH2 are maintained in the hold condition until a "+1" or "−1" sample is received, at which time the thresholds are updated and/or changed.

Figure 3:
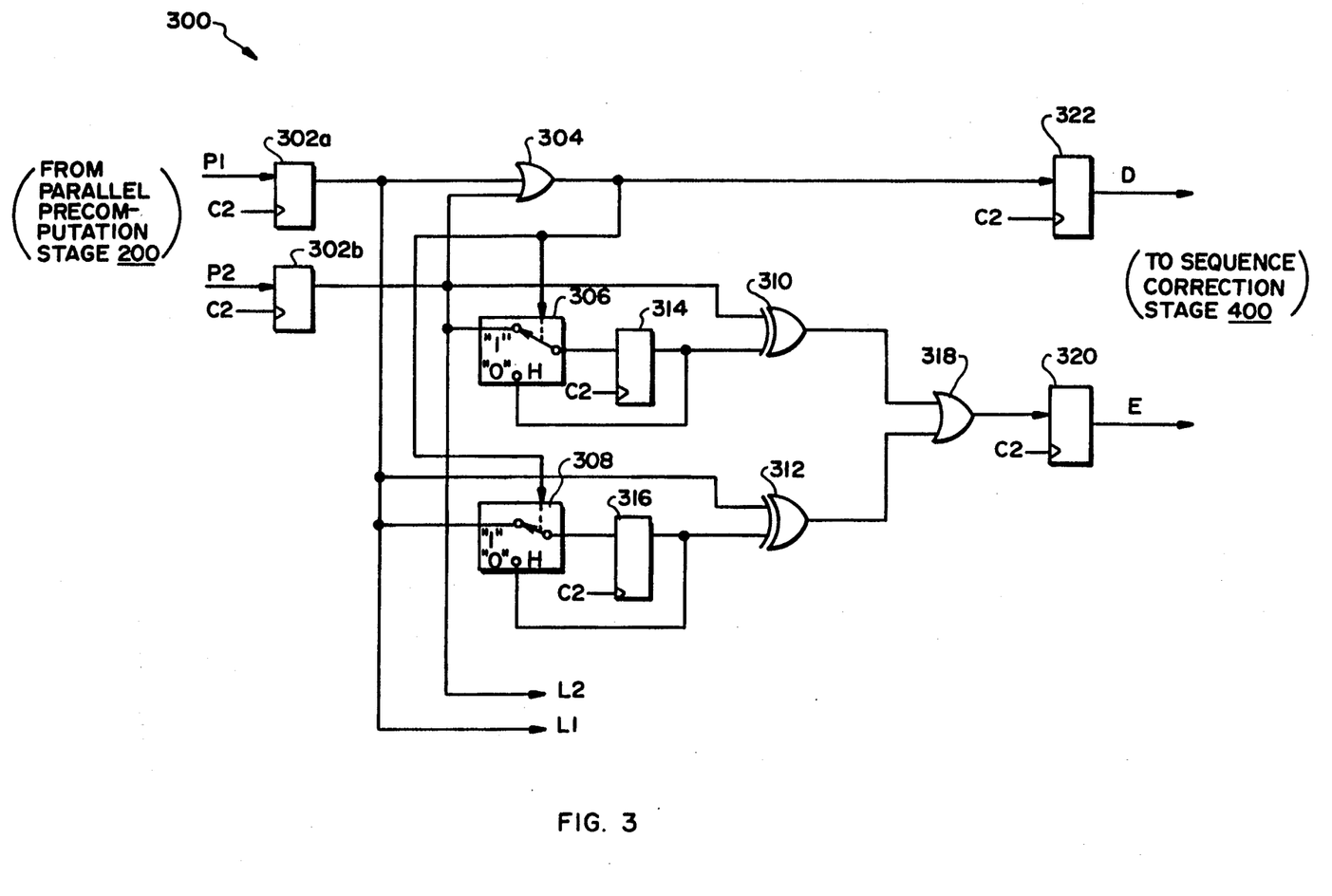
FIG. 3 is a circuit schematic of a sequence detection stage of the Viterbi decoder shown in FIG. 1.

The P1 and P2 signals from SW2 are provided to the sequence detection stage 300, shown in FIG. 3. These signals are temporarily stored in registers 302a,b, where they are reclocked by C2 to improve the timing of the data prior to being fed to SW1, SW2 as control signals L1, L2, respectively. Reclocking is desirable due to the large propagation delay tolerances of the comparators 212–220.

In one aspect of the invention, the sequence detection stage 300 designates a ternary level for the current sample Y, based on the values of P1 and P2. Specifically, these signals are provided as inputs to OR gate 304, which combines the results of the two threshold decisions into a single, two-valued bit-stream D such that "high" and "low" values become "1", and "middle" values become "0". The signals D are transferred to the data input of register 322 and thereafter provided to the sequence correction stage 400.

In another aspect of the invention, the sequence detection stage 300 checks the bit-stream D for violations of the alternate sequence property. Checking is accomplished, in part, by either holding the data D (hold state) or clocking it through to the next stage (clock state). Hold or clock state selection is determined by the output state of OR gate 304, i.e., the D signal, which controls the switches 306, 308 located at the inputs to the registers 314, 316 so that "1" values present in the data stream D are noted.

Specifically, a hold state is provided when D=1, which places the switches 306, 308 in the H terminal positions, thereby creating loops in conjunction with the registers 314, 316 at the inputs to the XOR gates 310, 312. On the next clock cycle, the outputs of the registers do not change since they are of the same polarities as the inputs.

In contrast, the clock state is provided when D=0, which configures the switches 306, 308 so that they receive the P2 and P1 signal values at their inputs. Here, one of the inputs to each XOR gate 310, 312 is delayed by a clock cycle (because of the respective register 314, 316) so that the inputs to the registers may be compared with their respective outputs. The results of these comparisons are combined in an OR gate 318, whose output is provided to the sequence correction stage 400, via register 320, as signal E.

Figures 4, 5:
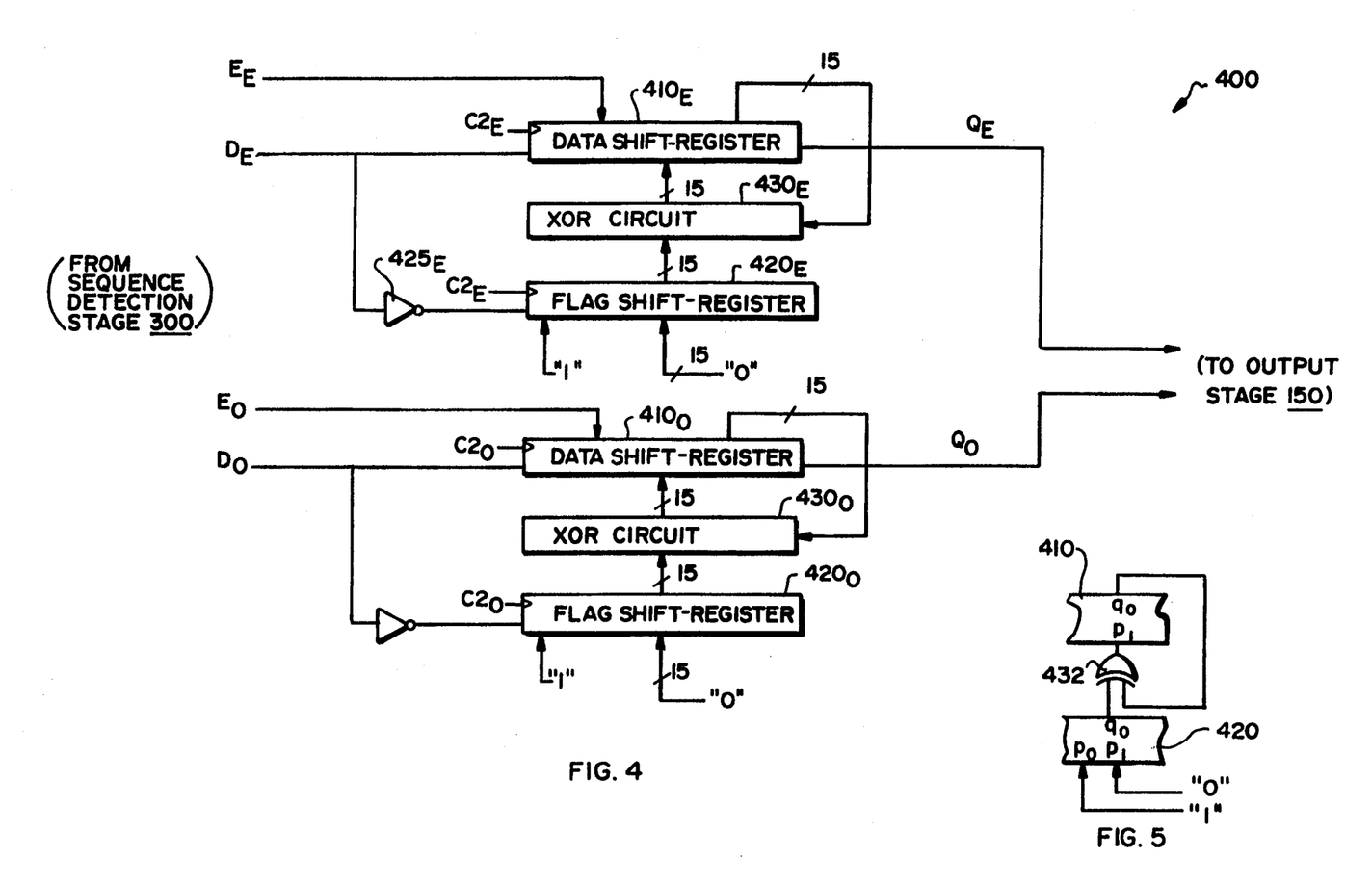
FIG. 4 is a block diagram of the circuits of a sequence correction stage of the Viterbi decoder shown in FIG. 1.
FIG. 5 is a schematized circuit depicting the interconnection of a portion of the circuits of the sequence correction stage.

FIG. 4 is a block diagram of the sequence correction stage 400, which comprises a plurality of shift-registers coupled to XOR gate circuits. Both the even and odd sample sections of the stage 400 are shown to illustrate generation of the output signals $Q_{E,O}$ which are fed to the recombine switch 155 of the output stage 150.

The sequence correction stage 400 provides a means for correcting selected D-stream bits for violations of the alternate sequence property. This is accomplished, in part, by "flagging" every "1" in the Dstream, out to a predetermined depth, with use of two 16-bit, shiftregisters (s-r). Accordingly, each section of the stage 400 comprises a 16-bit data s-r 410 for the data stream D, a 16-bit flag s-r 420 for the "flag" and an XOR circuit having 15 XOR gates.

FIG. 5 is a schematized circuit depicting the interconnection of a portion of the circuits of the sequence correction stage 400. The parallel outputs of each shift-register are coupled to respective inputs of the XOR gates so that during a load operation, the output $q_0$ of the data s-r 410 is "exclusively ORed" at the XOR gate 432 with the output $q_0$ of the flag s-r 420. The result of this operation is provided, via the output of the XOR gate 432, to the parallel input $p_1$ of the data s-r 410.

Referring again to FIG. 4, the bit-stream D is provided to the serial data input of the data s-r 410, while the signal E is presented to the parallel/serial control input of that register. An inverter 425 transposes the polarity of D at the control input to the flag s-r. In addition, the first input bit of the flag s-r 420 is hardwired to a logical "1", which value is stored into that register position during a load operation; the remaining parallel inputs are hardwired to logical "0".

The D and E signals enable shifting, loading and erasing of the contents of the shift-registers. Specifically, E=1 is a normal shift of 1-bit to the right, E=0 is a parallel load shift from the shift-registers to the XOR gates, D=1 is an erase (clear) and load operation and D=0 is a shift operation.

The flag s-r functions to keep track of a "bit-in-question" (an ambiguous "1" value) in the D data stream because the decision of whether to modify that bit is made by the sequence detection stage 300. Tracking is effected by loading the hardwired "1" into the first bit position (the "flag") of the flag s-r 420 simultaneously with the appearance of the hit-in-question in the data s-r 410, i.e., during a load operation. As "0" values are detected and received into the data s-r, the flag moves in sequence with the bit-in-question and tracks the location of that bit. When another "1" value is subsequently detected and determined to be of the same polarity as the bit-in-question, thus violating the sequence property, the latter, flagged bit is determined in error and is inverted. A parallel load operation produces this inversion. If the "1" value is subsequently detected and determined to be of the opposite polarity from the bit-in-question, the flagged bit is determined not in error and is simply shifted, unchanged, through the data s-r 410 to the output Q. There, the serial outputs of the two data s-r $410_{E,O}$ are coupled to the switch 155, where the even and odd data signals $Q_{E,O}$ are recombined and distributed as decoded, i.e., 0 or 1, bits.

Operation of the pipeline Viterbi decoder 100 will now be described with reference to FIGS. 1–5. A PR4 analog signal is converted to two, 6-bit streams of even and odd data samples Y at the input stage 110. The sample Y is then compared in magnitude with each of the unmodified previous sample Y' at comparator 212, the previous sample $<Y+A>$ at comparator 214, the previous sample $<Y-A>$ at comparator 216, the previous threshold TH1 at comparator 218 and the previous threshold TH2 at comparator 220. Two of the outputs of the comparators 212–220 are selected through switch SW2 so that "high", "middle" and "low" conditions may be assigned to the sample.

Initially, the outputs of comparators 218, 220 are selected because the control signals L1 and L2 each have a "0" state. These selected outputs are also selected by switch SW1 of the "hold-state" circuit and stored as threshold levels TH1 and TH2. After the next few clock cycles, the circuit operates to select two outputs from comparators 212–220 as threshold decision outputs P1 and P2 in accordance with the SW2 truth table. For example, if L1=1 and L2=0, the outputs of SW2 are P1=a and P2=c; that is, the output of comparators 212 and 216 are selected. If the current sample Y is greater than the previous unmodified sample Y', P1 has a value "1" and if Y is greater than the previous modified sample $<Y-A>$, P2 has a value "1".

The P1, P2 signals are then combined at OR gate 304 into a single, two-valued bit-stream D such that "high" and "low" values become "1", and "middle" values become "0". Information about the ternary level from which each "1" value is derived is obtained from the sequence detection stage 300, which examines the upper P1 and lower P2 threshold decisions. Specifically, the XOR gates 310, 312 compare inputs to the registers 314, 316 with their respective outputs and the results are combined in OR gate 318. Since no correction of data values is needed if "1" values result from alternations about the upper threshold, the comparison of inputs to outputs of the registers produce a "high" value at the output E of OR gate 318 which, in turn, establishes a normal serial shift of data through the sequence correction stage 400.

If two successive "1" values occur from the same "side" of the upper threshold, i.e., the same polarity, a parallel load operation (D=1, E=0) is performed to correct the flagged bit by inverting it. That is, the parallel load operation is performed on the contents of the shift-registers to change the bit-in-question from, e.g., a "high" to a "low". In accordance with one embodiment of the invention, the circuit changes the oldest bit-in-question, i.e., the bit that is further down in the sequence/shift-register.

If the next bit, i.e., following the bit-in-question, is of opposite polarity, an erase operation (D=1, E=1) is executed. That is, the bit is shifted down the register, the flag is erased and the sequence starts over. If a "low" value follows a "high", a normal shift (D=0, E=1) operation occurs. Any number of "lows" can occur after a "high" that is questionable. In this manner, every "high" of the data stream D is examined to ensure that it obeys the alternation sequence property of PR4 coding.

While we have described an illustrative embodiment for detecting a maximum-likelihood sequence of erroneous data values, it is to be understood that various other adaptations and modifications may be made within the spirit and scope of the invention. For example, the invention is applicable to a decoder having a similar, multi-stage pipeline topology, but with a parallel-precomputation stage having only two processing paths.

In this alternate embodiment, an adder circuit is included in one processing path to add the value A to the current sample Y and a subtractor circuit, embedded in another processing path, subtracts the value A from the sample Y. The sum and difference threshold results are compared with the current sample and, depending upon the need to update the thresholds, a feedback loop may intermittently add delays; however, the effects of these delays are minimal due to the overall architecture of the invention.

The improved Viterbi decoder described herein significantly improves the data throughput and processing speed of reliable, maximum-likelihood sequence detection and correction of erroneous signals in high frequency operations. High-speed processing is achieved by the pipeline topology and synchronous clocking arrangement among the stages of the Viterbi decoder, which enable single-cycle, processing of an input sample. In addition, the highly-parallel circuit configuration of the novel parallel-precomputation stage eliminates significant delays due to prior art feedback loop calculations.

The foregoing description has been directed to specific embodiments of this invention. It will be apparent, however, that other variations and modifications may be made to the described embodiments, with the attainment of some or all of their advantages. Therefore, it is the object of the appended claims to cover all such variations and modifications as come within the true spirit and scope of the invention.

What is claimed is:

1. A multi-stage pipelined Viterbi decoder capable of receiving and decoding a ternary-level signal represented by a sequence of digital samples, said decoder comprising:
   a parallel-precomputation stage for adaptively establishing a threshold range for each digital sample, said parallel-precomputation stage comprising a plurality of parallel-processing paths for generating a plurality of threshold reference levels and for comparing each of said reference levels with said digital sample to produce a plurality of comparison results, said parallel-precomputation stage further comprising switching means for selecting two of said comparison results as threshold decisions;
   a sequence detection stage, coupled to said parallel-precomputation stage, for designating a ternary level for said sample and converting said level to a binary value in response to said threshold decisions, said sequence detection stage being further configured to determine the validity of said binary value; and
   a sequence correction stage for inverting said binary value in response to an invalid determination by said sequence detection stage.

2. The multi-stage pipelined Viterbi decoder of claim 1 wherein at least two of said plurality of parallel-processing paths include respective adder and subtractor circuits.

3. The multi-stage pipelined Viterbi decoder of claim 2 wherein at least another of said plurality of parallel-processing paths includes means for establishing a previous threshold level.

4. The multi-stage pipelined Viterbi decoder of claim 1 wherein said sequence detection stage comprises at least one OR gate having said threshold decisions as inputs, said OR gate further converting said input threshold decisions into said binary value.

5. The multi-stage pipelined Viterbi decoder of claim 1 wherein said sequence correction stage comprises a plurality of shift-registers having parallel outputs coupled to inputs of a plurality of XOR gates.

6. The multi-stage pipelined Viterbi decoder of claim 1 further comprising an input stage for converting said ternary-level signal into said sequence of digital samples.

7. The multi-stage pipelined Viterbi decoder of claim 6 wherein said input stage further comprises means, coupled to said parallel-precomputation stage, for generating a value representing approximately half-amplitude of said ternary-level signal.

8. The multi-stage pipelined Viterbi decoder of claim 7 wherein said generating means comprises a thumbwheel circuit.

9. The multi-stage pipelined Viterbi decoder of claim 8 further comprising an output stage for providing said inverted binary value at an output of said decoder.

10. Apparatus for detecting and correcting a maximum-likelihood sequence of multi-level coded signals adapted for representation as samples, said apparatus comprising:
    means for converting said multi-level coded signals into said samples;
    means, coupled to said converting means, for comparing each sample with a plurality of predetermined reference values to generate a plurality of comparison results;
    means, coupled to said comparing means, for selecting at least two of said comparison results in response to selection control signals having states established by said at least two selected comparison results;
    means, coupled to said selection means, for designating a binary level for each sample;
    means, coupled to said selection means, for determining the validity of said binary level;
    means, coupled to said designating means and said determining means, for inverting said binary level in response to an invalid determination by said determining means, and
    means, coupled to said inverting means, for providing said inverted binary level at an output of said apparatus.

11. The apparatus of claim 10 wherein said comparing means comprises two comparators and wherein said plurality of predetermined reference values comprises two reference values.

12. The apparatus of claim 10 wherein said comparing means comprises five comparators and wherein said plurality of predetermined reference values comprises five reference values.

13. The apparatus of claim 12 wherein said converting means comprises an A/D converter configured to deliver a plurality of data streams of even and odd samples in response to said multi-level coded signals.

14. The apparatus of claim 13 wherein said A/D converter is further configured to deliver first and second half-rate clock signals in response to a received full-rate clock signal, said first half-rate clock signal being an inverted form of said second half-rate clock signal.

15. The apparatus of claim 14 wherein said plurality of data streams are staggered such that transitions in said even sample stream are half-way between transitions in said odd sample stream.

16. The apparatus of claim 15 wherein said providing means comprises a multiplexer switch timed by said first half-rate clock signal.

17. A method for detecting a maximum-likelihood sequence of multi-level coded signals adapted for representation as samples, said method comprising the steps of:

comparing each sample with a plurality of predetermined reference values to generate a plurality of comparison results;

selecting at least two of said comparison results in response to selection control signals having states established by said at least two selected comparison results;

responsive to said selected comparison results designating a binary level for each sample;

determining the validity of said binary level; and inverting said binary level in response to an invalid determination by said determining means.

* * * * *